United States Patent [19]

Sonokawa et al.

[11] Patent Number: 5,571,658

[45] Date of Patent: Nov. 5, 1996

[54] PHOTOSENSITIVE PLATE HAVING A PHOTOPOLYMERIZABLE PHOTOSENSITIVE LAYER AND A SILICONE RUBBER LAYER FOR PREPARING A LITHOGRAPHIC PRINTING PLATE REQUIRING NO FOUNTAIN SOLUTION

[75] Inventors: Koji Sonokawa; Seiji Uno, both of Shizuoka, Japan

[73] Assignee: Fuji Photo Film Co., Ltd., Minami-Ashigara, Japan

[21] Appl. No.: 520,572

[22] Filed: Aug. 29, 1995

[30] Foreign Application Priority Data

Sep. 7, 1994 [JP] Japan .................................. 6-214005

[51] Int. Cl.$^6$ .................................................. G03C 1/73
[52] U.S. Cl. ........................ 430/273.1; 430/18; 430/302; 101/453
[58] Field of Search .................. 430/18, 273.1, 430/302; 101/453

[56] References Cited

U.S. PATENT DOCUMENTS 5,397,681  3/1995  Tsuda et al. ............................ 430/273

FOREIGN PATENT DOCUMENTS

3811832A1  10/1988  Germany .
56-80047   7/1981   Japan .
63-253949  10/1988  Japan .
63-280250  11/1988  Japan .

*Primary Examiner*—George F. Lesmes
*Assistant Examiner*—Laura Weiner
*Attorney, Agent, or Firm*—Burns, Doane, Swecker & Mathis, LLP

[57] ABSTRACT

A photosensitive lithographic printing plate requiring no fountain solution is described, which comprises a support having provided thereon a photopolymerizable photosensitive layer and a silicone rubber layer in this order, wherein the photopolymerizable photosensitive layer contains at least one photopolymerizable monomer represented by the following formula (I) and a photopolymerization initiator:

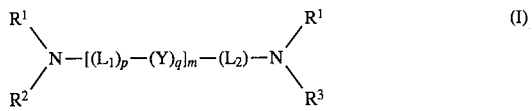

The monomer represented by formula (I) is described in detail in the specification. Furthermore, a process for producing a photosensitive lithographic printing plate requiring no fountain solution is also described, which comprises the steps of soaking the above-described photosensitive lithographic printing plate requiring no fountain solution in water or an organic solvent mainly comprising water, and removing the silicon rubber layer to form an image while soaking the plate.

16 Claims, No Drawings

PHOTOSENSITIVE PLATE HAVING A PHOTOPOLYMERIZABLE PHOTOSENSITIVE LAYER AND A SILICONE RUBBER LAYER FOR PREPARING A LITHOGRAPHIC PRINTING PLATE REQUIRING NO FOUNTAIN SOLUTION

FIELD OF THE INVENTION

The present invention relates to a photosensitive lithographic printing plate requiring no fountain solution, which comprises a support having provided thereon a photopolymerizable photosensitive layer and a silicone rubber layer in this order, has excellent sensitivity, tone reproducibility, press life, and scratch resistance, and can be developed with water or an organic solvent aqueous solution mainly comprising water (hereinafter referred to as "an aqueous developer").

BACKGROUND OF THE INVENTION

Various lithographic printing plates requiring no fountain solution for lithographic printing have been proposed. Among them, those comprising a support having formed thereon a photosensitive layer and an ink repellent layer in this order exhibit excellent performance. Materials of the ink repellent layer so far proposed include silicone rubber (e.g., JP-B-54-26923, JP-B-55-22781, JP-B-56-23150, JP-A-2-236550, the term "JP-B" as used herein means an "examined Japanese patent publication", and the term "JP-A" as used herein means an "unexamined published Japanese patent application") and fluorine resins (e.g., JP-A-58-215411, JP-A-2-103047). The silicone rubber is preferred for its ink repellency.

The photosensitive layer for use in positive lithographic printing plates comprises a photopolymerizable photosensitive composition which cures on exposure to light. Platemaking using this type of plates is generally carried out as follows. On exposure, the photosensitive layer on non-image area is cured and adhered firmly to the upper silicone rubber layer. In the subsequent development, a developer is prevented from penetrating into the exposed non-image area and from dissolving the photosensitive layer on that area thereby to form a non-image area composed of a silicon rubber layer. On the other hand, the unexposed image area is penetrated with a developer through the silicone rubber layer, and part of or the whole of the uncured photosensitive layer is dissolved with the developer. Thereafter, the silicone rubber layer on that area is removed by a physical force to form an image area.

Developing techniques for the lithographic printing plate requiring no fountain solution which can form an image as described above are disclosed in JP-B-56-23150, JP-A-57-13448, JP-A-59-146054 and JP-A-63-52145. However, since the developers used in these techniques mainly comprise an organic solvent, they are expensive and also need special care in handling because of their danger of ignition. To solve this problem, JP-A-1-159644 discloses use of a developer mainly comprising water. It is necessary that the photosensitive layer composition should contain a hydrophilic compound as a photopolymerizable monomer before such an aqueous developer can be employed. For example, monomers having a polyethylene oxide chain or a polypropylene oxide chain are disclosed in JP-A-4-174437, JP-A-4-338954, JP-A-5-94007, JP-A-5-224415, and JP-A-6-118629. A satisfactory image can be obtained by using the monomers proposed.

However, none of the conventional lithographic printing plates requiring no fountain solution which are developed with an aqueous developer satisfies all the requirements of sensitivity, tone reproducibility, press life, and scratch resistance sufficiently for practical use.

SUMMARY OF THE INVENTION

An object of the present invention is to provide a lithographic printing plate developable with an aqueous developer which has excellent sensitivity, tone reproducibility, press life and scratch resistance.

This and other objects of the present invention have been accomplished by a photosensitive lithographic printing plate requiring no fountain solution comprising a support having provided thereon a photopolymerizable photosensitive layer and a silicone rubber layer in this order, wherein the photopolymerizable photosensitive layer contains at least one photopolymerizable monomer represented by the following formula (I) and a photopolymerization initiator:

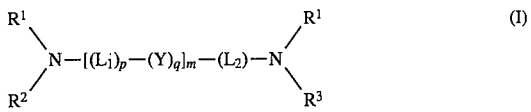

wherein m represents an integer of from 0 to 30; Y represents —COO—, —OCO—, —CONH—, —O—, —NH— or —S—; $L_1$ represents a substituted or unsubstituted alkylene group; $L_2$ represents a substituted or unsubstituted alkylene group, a substituted or unsubstituted phenylene group or a substituted or unsubstituted aralkylene group; p and q each represents 0 or 1; and $R^1$, $R^2$, and $R^3$ are the same or different and each represents a hydrogen atom, an alkyl group or a group represented by the following formula (II), provided that at least two of $R^1$, $R^2$ and $R^3$ are selected from the groups represented by the following formula (II).

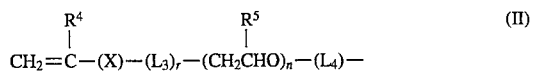

wherein n represents an integer of from 1 to 15, provided that the total number of ethylene oxide groups or propylene oxide groups in one molecule of a monomer represented by formula (I) is 30 or less; $R^4$ represents a hydrogen atom or an alkyl group having from 1 to 4 carbon atoms; $R^5$ represents a hydrogen atom or a methyl group, and the plurality of $R^5$ groups may be the same or different; X represents —COO—, —CONH— or a phenylene group; $L_3$ and $L_4$ each represent a substituted or unsubstituted alkylene group; and r represents 0 or 1.

Furthermore, this and other objects of the present invention have been accomplished with a process for producing a photosensitive lithographic printing plate requiring no fountain solution, which comprises the steps of soaking the above-described photosensitive lithographic printing plate requiring no fountain solution in water or an organic solvent mainly comprising water, and removing the silicon rubber layer to form an image while soaking the plate.

DETAILED DESCRIPTION OF THE INVENTION

According to the present invention, the photopolymerizable photosensitive layer comprises a polymeric compound as a binder and the monomeric compound represented by formula (I) with sufficient compatibility therebetween. On imagewise exposure, the compound represented by formula (I) in the photosensitive layer in the area corresponding to a non-image area undergoes photopolymerization to form a crosslinked high polymer having sufficient softness to be resistant against scratches and yet can withstand heavy printing duty to thereby provide a lithographic printing plate requiring no fountain solution with improved scratch resistance and a prolonged press life. Further, the water-wettable (hydrophilic) properties of the compound represented by formula (I) allows development with an aqueous developer to form a satisfactory image.

Support:

The lithographic printing plate requiring no fountain solution of the present invention has such pliability as to be set on an ordinary printing machine and at the same time withstand the printing pressure in printing. Accordingly, examples of the support for use in the present invention include coated paper, metal plates such as an aluminum plate, plastic films such as a polyethylene terephthalate film, rubber and composites thereof (e.g., paper sandwiched between a pair of aluminum sheets). Preferred supports are aluminum and aluminum alloys, such as alloys of aluminum with silicon, copper, manganese, magnesium, chromium, zinc, lead, bismuth or nickel.

Before an aluminum plate is used as a support, the plate is subjected to degreasing by spraying or dipping in an aqueous acid solution in order to remove rolling oil from its surface. While any of the acids known as degreasing agents for metals may be used, sulfuric acid or phosphoric acid is preferred. The acid processing is preferably followed by washing with water for an appropriate time. If desired, the degreased aluminum plate may be subjected to surface processing, such as graining, anodizing, or processing with an aqueous solution of silicate, e.g., sodium silicate or potassium silicate (that is, silicate processing). Among these, the silicate processing is preferred. In order to improve adhesion to a coating film, the support may further be processed with a silane coupling agent.

Primer Layer:

If desired, a primer layer may be provided between a support and a photosensitive layer. As a primer layer for use in the present invention, various primers can be selected for particular purposes, such as improvement of adhesion between a support and a photosensitive layer, antihalation, dyeing of an image area, and improvement of printing characteristics. Examples of the primer layer include a layer formed by applying a photosensitive polymer of various kinds and exposing the polymer to cure before forming a photosensitive layer as disclosed in JP-A-60-22903; a layer formed by thermosetting an epoxy resin as disclosed in JP-A-62-50760; a layer formed by hardening gelatin as disclosed in JP-A-63-133151; a layer formed by using a urethane resin and a silane coupling agent as disclosed in JP-A-3-200965; and a layer formed by using a urethane resin disclosed in JP-A-3-273248. A hardened film of gelatin or casein is also effective as a primer layer. To soften a primer layer, the above-mentioned primer layer may contain a polymer having a glass transition point of room temperature or less, such as polyurethane, polyamide, styrene-butadiene rubber, carboxy-modified styrene-butadiene rubber, acrylonitrile-butadiene rubber, carboxy-modified acrylonitrile-butadiene rubber, polyisoprene, acrylate rubber, polyethylene, chlorinated polyethylene or chlorinated polypropylene. The amount of the polymer added is arbitrary. It is possible to form a primer layer solely of these polymers as long as the coating solution has film-forming properties. The primer layer may further contain various additives meeting the above-mentioned purposes, for example dyes, pH indicators, print-out agents, photopolymerization initiators, adhesion assistants (e.g., polymerizable monomers, diazo resins, silane coupling agents, titanate coupling agents, aluminum coupling agents), pigments (e.g., titanium dioxide), and silica powder. The primer layer may be hardened or cured on exposure to light after application. In general, the primer layer is applied to a dry thickness of from 0.1 to 20 g/m$^2$, preferably from 1 to 10 g/m$^2$.

Photosensitive Layer:

The photopolymerizable photosensitive layer according to the present invention contains at least (1) a photopolymerizable monomer represented by formula (I), (2) a photopolymerization initiator, and (3) a film-formable polymeric compound. If desired, the layer may contain (4) a monomer or oligomer having a polymerizable ethylenically unsaturated group other than the monomer represented by formula (I).

Component (1): Monomer Represented by Formula (I)

In formula (I), m represents an integer of from 0 to 30, preferably from 0 to 10.

Y represents —COO—, —OCO—, —CONH—, —O—, —NH— or —S—, preferably —O—.

$L_1$ represents a substituted or unsubstituted alkylene group, preferably containing from 1 to 10 carbon atoms, such as an ethylene group or a propylene group. Examples of substituents include an alkyl group, an aryl group, an alkoxy group, a hydroxyl group, and a halogen atom, in which the alkyl or alkoky group preferably contains from 1 to 5 carbon atoms, the aryl group preferably contains from 6 to 20 carbon atoms, and the halogen atom includes a chlorine atom.

$L_2$ represents a substituted or unsubstituted alkylene, phenylene or aralkylene group, preferably containing from 1 to 10 carbon atoms, such as an ethylene group, a propylene group, or a xylylene group. Examples of substituents include an alkyl group, an aryl group, an alkoxy group, a hydroxyl group, and a halogen atom, in which the alkyl or alkoxy group preferably contains from 1 to 5 carbon atoms, the aryl group preferably contains from 6 to 20 carbon atoms, and the halogen atom includes a chlorine atom.

p and q each represent 0 or 1.

$R^1$, $R^2$, and $R^3$ are the same or different and each represents a hydrogen atom, an alkyl group (preferably alkyl group having from 1 to 10 carbon atoms, e.g., methyl, ethyl) or a group represented by formula (II), provided that at least two of $R^1$, $R^2$, and $R^3$ are selected from the groups represented by formula (II).

In formula (II), $R^4$ represents a hydrogen atom or an alkyl group having from 1 to 4 carbon atoms (e.g., methyl, ethyl), preferably a hydrogen atom or a methyl group.

$R^5$ represents a hydrogen atom or a methyl group, preferably a methyl group; and n represents an integer of from 1 to 15, preferably from 1 to 5 (the plurality of $R^5$ groups may be the same or different), provided that the total number of ethylene oxide or propylene oxide groups in one molecule of the monomer represented by formula (I) is 30 or less.

X represents —COO—, —CONH— or a phenylene group, preferably —COO—.

$L_3$ and $L_4$ each represent a substituted or unsubstituted alkylene group, preferably containing from 1 to 10 carbon atoms (e.g., ethylene or propylene). Examples of substituents include an alkyl group, an aryl group, an alkoxy group, a hydroxyl group, and a halogen atom, in which the alkyl or alkoxy group preferably contains from 1 to 5 carbon atoms, the aryl group preferably contains from 6 to 20 carbon atoms, and the halogen atom includes a chlorine atom.

r represents 0 or 1, preferably 0.

If the total number of ethylene oxide groups or a propylene oxide groups in the molecule exceeds 30, with the weight ratio of the monomer represented by formula (I) in the photopolymerizable composition being fixed, the proportion of the unsaturated groups decreases to reduce sensitivity. If the monomer represented by formula (I) contains no ethylene or propylene oxide groups, it would have insufficient water-wettability, thereby failing to provide a cured film developable with an aqueous developer. As the number of ethylene oxide and propylene oxide groups per molecule increases, the photo-cured photosensitive layer becomes more water-wettable and softer to assure tone reproducibility as a plate and a long press life and excellent scratch resistance as a printing plate. The number is preferably from 2 to 25.

The photopolymerizable monomers represented by formula (I) may be used either individually or as a combination of two or more thereof. The monomers represented by formula (I) are used in an amount of from 1 to 80%, preferably 5 to 60%, and more preferably 10 to 40%, by weight based on all compositions in the photopolymerizable photosensitive layer.

Specific examples of the monomers represented by formula (I) are shown below only for an illustrative purpose but not for limitation.

$$\text{No. 1:} \quad [CH_2=CCOO(CH_2CHO)_4CH_2CH]_2NCH_2CH_2N[CHCH_2(OCHCH_2)_4OCOC=CH_2]_2 \text{ with } CH_3 \text{ groups}$$

$$\text{No. 2:} \quad (CH_2=CCOOCH_2CHOCH_2CH)_2N(CH_2CHO)_6CH_2CHN(CHCH_2OCHCH_2OCOC=CH_2)_2 \text{ with } CH_3 \text{ groups}$$

$$\text{No. 3:} \quad (CH_2=CCOOCH_2CHOCH_2CH)_2N(CH_2CH_2O)_6CH_2CH_2N(CHCH_2OCHCH_2OCOC=CH_2)_2 \text{ with } CH_3 \text{ groups}$$

$$\text{No. 4:} \quad [CH_2=CCOO(CH_2CH_2O)_4CH_2CH_2]_2NCH_2CH_2N[CH_2CH_2(CH_2CH_2O)_4OCOC=CH_2]_2 \text{ with } CH_3 \text{ groups}$$

$$\text{No. 5:} \quad (CH_2=CCOOCH_2CH_2OCH_2CH_2)_2N(CH_2CHO)_6CH_2CHN(CH_2CH_2OCH_2CH_2OCOC=CH_2)_2 \text{ with } CH_3 \text{ groups}$$

$$\text{No. 6:} \quad (CH_2=CCOOCH_2CH_2OCH_2CH_2)_2N(CH_2CH_2O)_6CH_2CH_2N(CH_2CH_2OCH_2CH_2OCOC=CH_2)_2 \text{ with } CH_3 \text{ groups}$$

$$\text{No. 7:} \quad [CH_2=CHCOO(CH_2CHO)_4CH_2CH]_2NCH_2CH_2N[CHCH_2(OCHCH_2)_4OCOCH=CH_2]_2 \text{ with } CH_3 \text{ groups}$$

$$\text{No. 8:} \quad (CH_2=CHCOOCH_2CHOCH_2CH)_2N(CH_2CHO)_6CH_2CHN(CHCH_2OCHCH_2OCOCH=CH_2)_2 \text{ with } CH_3 \text{ groups}$$

$$\text{No. 9:} \quad (CH_2=CHCOOCH_2CHOCH_2CH)_2N(CH_2CH_2O)_6CH_2CH_2N(CHCH_2OCHCH_2OCOCH=CH_2)_2 \text{ with } CH_3 \text{ groups}$$

$$\text{No. 10:} \quad [CH_2=CHCOO(CH_2CH_2O)_4CH_2CH_2]_2NCH_2CH_2N[CH_2CH_2(OCH_2CH_2)_4OCOCH=CH_2]_2$$

$$\text{No. 11:} \quad (CH_2=CHCOOCH_2CH_2OCH_2CH_2)_2N(CH_2CHO)_6CH_2CHN(CH_2CH_2OCH_2CH_2OCOCH=CH_2)_2 \text{ with } CH_3 \text{ groups}$$

$$\text{No. 12:} \quad (CH_2=CHCOOCH_2CH_2OCH_2CH_2)_2N(CH_2CH_2O)_6CH_2CH_2N(CH_2CH_2OCH_2CH_2OCOCH=CH_2)_2$$

No. 13:

$$CH_2=CCOO(CH_2CHO)_3CH_2CH \diagdown \qquad \diagup CHCH_2(OCHCH_2)_3OCOC=CH_2$$
$$\qquad \qquad \qquad \qquad NCH_2CH_2N$$
$$CH_2=CCOOCH_2\ CH \diagup \qquad \diagdown CHCH_2OCOC=CH_2$$

(with $CH_3$ substituents)

No. 14:

$$CH_2=CCOO(CH_2CHO)_3CH_2CH \diagdown \qquad \diagup CHCH_2OCOC=CH_2$$
$$\qquad \qquad \qquad \qquad NCH_2CH_2N$$
$$CH_2=CCOO(CH_2CHO)_3CH_2CH \diagup \qquad \diagdown CHCH_2OCOC=CH_2$$

(with $CH_3$ substituents)

Component (2): Photopolymerizable Initiator

The photopolymerization initiator for use in the present invention can be selected from compounds, either sensitized or non-sensitized, capable of generating radicals through photolysis. Specific but non-limiting examples of photopolymerization initiators include:

(a) benzophenone derivatives, such as benzophenone, dimethylaminobenzophenone, diethylaminobenzophenone, xanthone, anthrone, thioxanthone, acridone, 2-chloroacridone, 2-chloro-N-n-butylacridone, 2,4-diethylthioxanthone, and fluorenone;

(b) benzoin derivatives, such as benzoin, benzoin methyl ether, and benzoin ethyl ether;

(c) quinones, such as p-benzoquinone, β-naphthoquinone, and β-methylanthraquinone;

(d) sulfur compounds, such as dibenzyl disulfide and di-n-butyl disulfide;

(e) azo or diazo compounds, such as 2-azobisisobutyronitrile, 1-azo-bis-1-cyclohexanecarbonitrile, p-diazobenzylethylaniline, and Congo Red;

(f) halogen compounds, such as carbon tetrachloride, silver bromide, α-chloromethylnaphthalene, trihalomethyl-s-triazine compounds, and trihalomethyloxadiazole compounds; and (g) peroxides, such as benzoyl peroxide.

These initiators may be used either individually or as a combination of two or more thereof. The initiator is used in an amount of from 0.1 to 25%, preferably from 3 to 20%, by weight, based on all compositions in the photopolymerizable photosensitive layer.

Component (3): Film-Formable Polymeric Compound

The film-formable polymeric compounds for use in the present invention include polymers or copolymers described below.

(1) vinyl polymers, such as polyvinyl acetate, polyvinyl alcohol, polyvinyl butyral, polyvinyl methyl ether, polyvinyl chloride, polyethylene, and copolymers thereof;

(2) (meth)acrylate polymers, alkyl(meth)acrylamide polymers, such as polyethyl (meth)acrylate, polybutyl (meth)acrylate, poly-t-butylacrylamide, polydiacetonacrylamide, and copolymers thereof;

(3) unvulcanized rubber, such as natural rubber, polybutadiene, polyisobutylene, polyneoprene, and copolymers thereof;

(4) polyethers, such as polyethylene oxide, and polypropylene oxide;

(5) polyamides, such as copolymers of caprolactam, laurolactam, hexamethylenediamine, 4,4'-bis-aminocyclohexylmethane, 2,4,4-trimethylhexamethylenediamine, isophoronediamine, diglycols, isophthalic acid, adipic acid and sebacic acid;

(6) polyesters, such as a condensation product between terephthalic acid or adipic acid and ethylene glycol or 1,4-butanediol; and (7) polyurethanes, such as those obtained from hexamethylene diisocyanate, tolylene diisocyanate, naphthalene-1,5-diisocyanate or isophorone diisocyanate and ethylene glycol, 1,4-butanediol or polyester.

Isophoronediamine or hexamethylenediamine may be used as a chain extender.

Additionally, high polymers having a photopolymerizable or photo-crosslinkable olefinically unsaturated double bond on their side chain(s) can also be used as film-formable polymeric compounds.

The above-mentioned polymeric compounds may be used either individually or as a combination of two or more thereof. They are used in an amount of from 10 to 90%, preferably from 25 to 75%, by weight based on all compositions in the photopolymerizable photosensitive layer.

Component (4): Monomer or Oligomer having a Polymerizable Ethylenically Unsaturated Group other than the Monomer Represented by Formula (I)

The monomer or oligomer other than the monomer represented by formula (I) for use in the present invention includes:

(A) acrylates or methacrylates of alcohols (for example, glycerol, hexanediol, trimethylolpropane, pentaerythritol, sorbitol, triethylene glycol, (poly)ethylene glycol, (poly)propylene glycol); ethylene oxide, propylene oxide, combined adducts of glycerol, hexanediol, trimethylolpropane, pentaerythritol or sorbitol;

(B) reaction products obtained from glycidyl acrylate, glycidyl methacrylate or allylglycidyl and amines (e.g., ethylamine, ethylenediamine, hexamethylenediamine, diethylenetriamine, xylylenediamine, ethanolamine, aniline);

(C) reaction products obtained from glycidyl acrylate, glycidyl methacrylate or allylglycidyl and carboxylic acids (e.g., acrylic acid, methacrylic acid, succinic acid, maleic acid, phthalic acid); and (D) amide derivatives (e.g., methylenebisacrylamide, xylylenediacrylamide).

Specific examples thereof include polyfunctional acrylates or methacrylates, such as urethane acrylates as described in JP-B-48-41708, JP-B-50-6034, and JP-A-51-37193, polyester acrylates as described in JP-A-48-64183, JP-B-49-43191, and JP-B-52-30490, and epoxy acrylates obtained from an epoxy resin and (meth)acrylic acid; and N-methylolacrylamide derivatives described in U.S. Pat. No. 4,540,649. Additionally, photocuring monomers and oligomers described in *Nihon Settyakuzai Kyokai* (*Japan Adhesion Association*), Vol.20, No.7, pp.300–308 (1984) are also employable. These examples are by no means limiting the monomers or oligomers usable in the present invention, and the unsaturated groups in the polyfunctional monomers may be a mixture of an acryl group, a methacryl group, an allyl group or a vinyl group. The above-mentioned photopolymerizable monomers or oligomers may be used either individually or as a combination of two or more thereof.

The photopolymerizable monomers or oligomers other than the monomer represented by formula (I) (Component (4)) may be used in an amount of from 0 to 30% by weight, preferably from 3 to 20% by weight, based on all components in the photopolymerizable photosensitive layer.

Other Components:

In addition to the aforesaid components, a thermal polymerization inhibitor is preferably contained. Example thereof include hydroquinone, p-methoxyphenol, di-t-butyl-p-cresol, pyrogallol, t-butyl catechol, 4,4'-thiobis(3-methyl-6-t-butylphenol), 2,2'-methylenebis(4-methyl-6-t-butylphenol), and 2-mercaptobenzimidazole. For the purpose of coloring the photopolymerizable photosensitive layer, the composition may contain a dye or a pigment or, as a printing-out agent, a pH indicator or a leuco dye. According to the end use, the composition may further contain a small amount of a silicone compound, such as polydimethylsiloxane, methylstyrene-modified polydimethylsiloxane, olefin-modified polydimethylsiloxane, polyether-modified polydimethylsiloxane, a silane coupling agent, silicone diacrylate, or a silicone dimethacrylate. A silicone surfactant or fluorine surfactant may be added for the improvement of coating properties. A diazo resin may be added for the improvement of adhesion of a photopolymerizable photosensitive layer and a primer layer. Further, a plasticizer for the improvement of softness (e.g., polyethylene glycol, polypropylene glycol, tricresyl phosphate) or a stabilizer (e.g., phosphoric acid) may be added. These additives are generally used in an amount of 10% or less by weight based on all compositions in the photopolymerizable photosensitive layer. In some cases, hydrophobic silica powders having been processed with a (meth)acryloyl or allyl group-containing silane coupling agent may be added in an amount of 10% or less by weight based on all compositions in the photopolymerizable photosensitive layer.

The above-described photopolymerizable photosensitive compositions are applied to a support in the form of a solution in an appropriate solvent, such as water, 2-methoxyethanol, 2-methoxyethyl acetate, propylene glycol methylethyl acetate, methyl lactate, ethyl lactate, propylene glycol monomethyl ether, ethanol, methyl ethyl ketone, N,N-dimethylacetamide, methyl pyruvate, ethyl pyruvate, methyl 3-methoxypropionate, and a mixture thereof. The coating thickness thereof after drying is from 0.1 to 20 g/m$^2$, preferably from 0.5 to 10 g/m$^2$.

Ink Repellent Layer:

Examples of the ink repellent layer for use in the present invention include a silicone rubber layer comprising a cured film of composition A or B described below.

Composition A (condensation type):

Composition A, which is a condensation type, comprises (a) 100 parts by weight of a diorganopolysiloxane having a number average molecular weight of from 3,000 to 200,000, (b) 3 to 70 parts by weight of a condensation crosslinking agent, and (c) 0.01 to 40 parts by weight of a catalyst.

The diorganopolysiloxane as component (a) is a polymer comprising a repeating unit represented by formula (i):

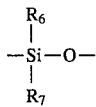
(i)

wherein $R^6$ and $R^7$ each represents a substituted or unsubstituted alkyl group having 1 to 10 carbon atoms, a substituted or unsubstituted vinyl group or a substituted or unsubstituted aryl group. In general, those in which at least 60% of $R^6$ and $R^7$ comprises a methyl group, a halogenated vinyl group or a halogenated phenyl group are preferably used.

A diorganopolysiloxane having a hydroxyl group at both terminals thereof is preferred. Component (a) has a number average molecular weight of from 3,000 to 200,000, preferably from 5,000 to 100,000.

Component (b) is not particularly limited as long as it is of a condensation type. Those represented by formula (ii) shown below are preferred.

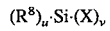
(ii)

(u+v=4, v is 2 or more)
wherein $R^8$ represents an alkyl group having 1 to 10 carbon atoms, a vinyl group or an aryl group, which each may be substituted; X represents a hydrogen atom, a halogen atom (e.g., Cl, Br, I), —OH, —OCOR$^9$, —OR$^9$ (wherein R$^9$ has the same meaning as R$^8$) or a group represented by the following formula:

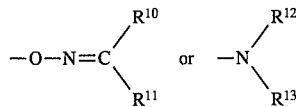

wherein $R^{10}$, $R^{11}$, $R^{12}$ and $R^{13}$ each represents an alkyl group having 1 to 10 carbon atoms; u represents 0, 1 or 2; v represents 2, 3 or 4; and u+v is 4.

Component (c) is a known catalyst, including carboxylic acid metal salts (e.g., tin, zinc, lead, calcium, manganese), such as dibutyltin laurate, lead octylate, and lead naphthenate, and chloroplatinic acid.

Composition B (addition type):

Composition B, which is an addition type, comprises (d) 100 parts by weight of a diorganopolysiloxane having an addition reactive functional group having a number average molecular weight of from 3,000 to 200,000, (e) 0.1 to 10 parts by weight of an organohydrogenpolysiloxane, and (f) 0.00001 to 1 part by weight of a catalyst for addition.

The diorganopolysiloxane having an addition reactive functional group as component (d) is an organopolysiloxane having at least two alkenyl groups (preferably vinyl groups) directly bonded to the silicon atom per molecule and having a number average molecular weight of from 3,000 to 200,000. The diorganopolysiloxane described in JP-A-6-083045 can be used as component (d). The alkenyl group may be either at the molecular terminals or in the middle of the molecular chain. The organic groups other than the alkenyl group include a substituted or unsubstituted alkyl group having 1 to 10 carbon atoms and a substituted or unsubstituted aryl group. Component (d) may contain a trace amount of a hydroxyl group. The number average molecular weight of component (d) is from 3,000 to 200,000, preferably from 5,000 to 100,000.

Examples of component (e) includes both end-hydrogen-terminated polydimethylsiloxane, α,ω-dimethylpolysiloxane, a both end-methyl-terminated (methylsiloxane) (dimethylsiloxane) copolymer, cyclic polymethylsiloxane, both end-trimethylsilyl-terminated polymethylsiloxane, and a both end-trimethylsilyl-terminated (dimethylsiloxane) (methylsiloxane) copolymer disclosed in JP-A-4-68353.

Component (f) is selected from known catalysts for addition reaction. In particular, platinum compounds, such as platinum, platinum chloride, chloroplatinic acid, and olefin-coordinated platinum, are preferred.

Compositions A and B may each contain a crosslinking restrainer to control the curing rate of the composition. Suitable crosslinking restrainers include vinyl-containing organopolysiloxane, such as tetracyclo(methylvinyl)siloxane, alcohols containing a carbon-carbon triple bond, acetone, methyl ethyl ketone, methanol, ethanol, and propylene glycol monomethyl ether.

If desired, the silicone rubber layer may contain fine powder of an inorganic substance, such as silica, calcium carbonate or titanium oxide; an adhesion assistant, such as a silane coupling agent or an aluminum coupling agent; a photopolymerization initiator; an aromatic group-substituted polydimethylsiloxane as disclosed in JP-A-1-179047; and silicone oil.

From the standpoint of curing properties, composition B, i.e., addition type silicone composition, is preferably used.

If the ink repellent layer is too thin, it has reduced ink repellency and tends to suffer scrapes or scratches. If it is too thick, developability is deteriorated. From these considerations, the thickness of the ink repellent layer after drying is preferably from 0.5 to 5 g/m², still preferably from 1 to 3 g/m².

If desired, an additional ink repellent layer of various kinds may be formed on the above-mentioned silicone rubber layer. An intermediate layer may be provided between the photopolymerizable photosensitive layer and the ink repellent layer for the purpose of increasing adhesion between the photopolymerizable photosensitive layer and the ink repellent layer or for the protection of the catalyst in the composition for an ink repellent layer against catalyst poisoning.

Cover Film:

For the protection of the ink repellent layer, a transparent film of, e.g., polyethylene, polypropylene, polyvinyl chloride, polyvinylidene chloride, polyvinyl alcohol, polyethylene terephthalate or cellophane, may be laminated on the ink repellent layer, or the ink repellent layer may be coated with a polymer. The film may be a stretched film. The film may be a mat film which provides intimate contact with a printing frame at the time of imagewise exposure. In order to improve strippability of the protecting film, the film may have a releasing coat on its side to be brought into contact with an ink repellent layer.

Developing Processing:

The lithographic printing plate requiring no fountain solution of the present invention is imagewise exposed to light through a transparent original and developed with an aqueous developer. Known aqueous developers include water (e.g., tap water, pure water, distilled water) and water having dissolved therein a polar organic solvent with or without the aid of a surfactant. Examples of the organic polar solvents include alcohols (e.g., methanol, ethanol, propanol, isopropyl alcohol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol); ketones (e.g., acetone, methyl ethyl ketone); esters (e.g., ethyl acetate, methyl lactate, butyl lactate, propylene glycol monomethyl ether acetate, diethylene glycol acetate, diethyl phthalate); triethyl phosphate; and tricresyl phosphate. The aqueous developer may contain an alkali agent, e.g., sodium carbonate, diethanolamine or sodium hydroxide. Taking the possibility of environmental pollution and danger of ignition into consideration, it is preferred to use only water as an aqueous developer.

If desired, dyeing of image areas can be carried out simultaneously with development by using a developer containing a dye, such as Crystal Violet, Victoria Pure Blue or Astrazone Red.

Development can be carried out in a conventional manner, for example, by soaking the plate in an aqueous developer in a developing tray and rubbing the surface of the plate therein or by spraying the surface of the plate with an aqueous developer and then brushing with a developing brush in water. The developing temperature is arbitrary and preferably from 10° to 60° C. Thus, the ink repellent layer is removed from the image area to provide ink receiving areas.

The exposed image area of the resulting printing plate can be visualized by dyeing with a dye so as to confirm the image formation. Unless the developer contains a dye for image area dyeing, the image area can be processed with a dyeing liquid after development. In this case, only the exposed photosensitive layer providing an image area is dyed by lightly rubbing with a pad impregnated with a dyeing liquid thereby lending confirmation to sufficient development up to the highlight. The dyeing liquid to be used is a solution or dispersion of one or more dyes selected from disperse dyes, acid dyes and basic dyes in a medium, such as water, alcohols, ketones, ethers, or mixtures thereof. In order to improve dyeing properties, carboxylic acids, amines, surfactants, dyeing assistants, and antifoaming agents may be added.

The plate dyed with a dyeing liquid is preferably washed with water and dried to remove any dye adhered to the non-image area or the reverse side of the plate and to inhibit stickiness of the printing side thereby improving handling properties of the plate.

If the resulting printing plates are stored in a pile, it is preferred to put an interleaving sheet between plates for protection.

The aforesaid development, dyeing, washing and drying are preferably conducted with an automatic processing machine. A preferred automatic processing machine is described in JP-A- 2-220061.

The present invention will now be illustrated in greater detail with reference to the following Synthesis Examples and Examples, but it should be understood that the present invention is not construed as being limited thereto. Unless otherwise indicated, all percents and parts are given by weight.

SYNTHESIS EXAMPLE 1

Synthesis of Compound A

Compound A:

$$[CH_2=CCOO(CH_2CHO)_mCH_2CH]_2NCH_2CH_2N[CHCH_2(OCHCH_2)_mOCOC=CH_2]_2$$
with each carbon bearing a $CH_3$ substituent as shown A mixture of m=3.5

To an ethyl acetate solution of 11 g (0.01 mol) of N,N,N',N'-tetra(polypropylene oxide)ethylenediamine (a mixture of m=3.5; Mw: 400), 4.8 g (0.048 mol) of triethylamine, and 62 mg (0.56 mmol) of hydroquinone was added dropwise an ethyl acetate solution of 5.0 g (0.048 mol) of methacrylic acid chloride. The mixture was stirred at 50° C. for 4 hours, followed by extraction. The extract was washed and distilled under reduced pressure to remove the solvent, and the residue was purified with column chromatography to give 9.8 g of compound A.

SYNTHESIS EXAMPLE 2

Synthesis of Compound B

Compound B:

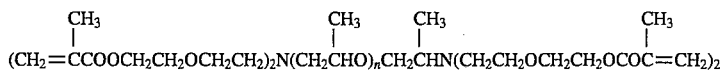

A mixture of n=5.6

To an acetonitrile solution of 10.0 g (0.025 mol) of polyoxypropylenediamine ("D-400" produced by Texaco, Inc.; a mixture of n=5.6; Mw: 400) and 12.1 g (0.12 mol) of triethylamine was added dropwise an acetonitrile solution of 14.9 g (0.12 mol) of 2-(2-chloroethoxy)ethanol, followed by stirring at room temperature for 5 hours to obtain an oily compound. In acetonitrile were dissolved 10 g (0.013 mol) of the resulting compound, 1.6 g (0.016 mol) of triethylamine, and 6 mg (0.054 mmol) of hydroquinone, and 1.7 g (0.016 mol) of methacrylic acid chloride was added thereto dropwise. The mixture was stirred at 50° C. for 4 hours and extracted with ethyl acetate. The extract was washed with water, and the solvent was removed by distillation under reduced pressure to give 10.5 g of compound B.

EXAMPLES 1 TO 9 AND COMPARATIVE EXAMPLES 1 TO 7

1) Primer Layer:

A 0.3 mm thick JIS A1050 aluminum plate which had been degreased in a conventional manner was dipped in a 1% aqueous solution of an aminosilane coupling agent KBM 603 (produced by Shin-Etsu Chemical Co., Ltd.) and dried at room temperature. A primer layer having the following composition was applied to the aluminum plate to a dry thickness of 4 g/m² and dried by heating at 140° C. for 2 minutes.

| Primer: | |
|---|---|
| Sanprene IB1700D (produced by Sanyo Chemical Industries, Ltd.) | 10 parts |
| Hexafluorophosphate of a polycondensate of p-diazodiphenylamine and p-formaldehyde | 0.1 part |
| TiO$_2$ | 0.1 part |
| MCF323 (produced by Dainippon Ink and Chemicals, Inc.) | 0.03 part |
| Propylene glycol methyl ether acetate | 50 parts |
| Methyl lactate | 20 parts |
| Pure water | 1 part |

The coating layer was exposed to 20 counts of light using a vacuum exposing machine FT261V UDNS ULTRA-PLUS FLIPTOP PLATE MAKER, manufactured by NUARC COMPANY, INC. to form a primer layer.

2) Photosensitive Layer:

A photopolymerizable photosensitive composition having the following composition was applied to the primer layer to a dry thickness of 4 g/m² and dried at 100° C. for 1 minute.

| Photopolymerizable Composition: | |
|---|---|
| Polyurethane resin [isophorone diisocyanate/polyester (adipic acid/1,4-butanediol/2,2-dimethylpropane-1,3-diol)/isophoronediamine] | 1.5 part |
| Polyfunctional monomer shown in Table 1 | see Table 1 |
| Ethyl Michler's ketone | 0.35 part |
| 2-Chlorothioxanthone | 0.10 part |
| Naphthalenesulfonate of Victoria Pure Blue BOH | 0.01 part |
| MCF323 (produced by Dainippon Ink and | 0.03 part |

| -continued | |
|---|---|
| Photopolymerizable Composition: | |
| Chemicals, Inc.) | |
| Methyl ethyl ketone | 10 parts |
| Propylene glycol methyl ether | 25 parts |

3) Ink Repellent Layer:

A silicone rubber composition shown below was applied onto the photosensitive layer to a dry thickness of 2 g/m² and dried at 140° C. for 2 minutes.

| Silicone Rubber Composition: | |
|---|---|
| α,ω-Divinylpolydimethylsiloxane (degree of polymerization: about 700) | 9 parts |
| (CH$_3$)$_3$—Si—O—(SiH(CH$_3$)—O)$_8$—Si(CH$_3$)$_3$ | 0.5 part |
| Polydimethylsiloxane (degree of polymerization: about 8,000) | 0.5 part |
| Olefin-chloroplatinic acid | 0.2 part |
| Tetracyclo(methylvinyl)siloxane | 0.3 part |
| Isopar G (produced by Esso Chemical Co., Ltd.) | 140 parts |

A 12 μm thick single sided matted biaxially stretched film of polypropylene was laminated on the silicone rubber layer with its non-matted side in contact with the silicone rubber layer to obtain a lithographic printing plate requiring no fountain solution according to the present invention.

TABLE 1

| Example No. | Compound | Amount Added (part) |
|---|---|---|
| 1 | A | 1.5 |
| 2 | A | 1.0 |
| 3 | B | 1.5 |
| 4 | C | 1.5 |
| 5 | D | 1.5 |
| 6 | E | 1.5 |
| 7 | F | 1.5 |
| 8 | A:G = 1:1 | 1.5 |
| 9 | A:H = 1:1 | 1.5 |
| Comparative Example No. | | |
| 1 | G | 1.5 |
| 2 | H | 1.5 |
| 3 | I | 1.5 |
| 4 | J | 1.5 |
| 5 | K | 1.5 |
| 6 | L | 1.5 |
| 7 | G:I = 1:1 | 1.5 |

Compound C:

A mixture of m=1.5

Compound D:

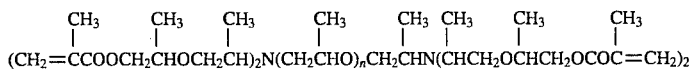

A mixture of n=5.6

Compound E:

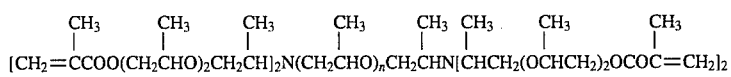

A mixture of n=5.6

Compound F:

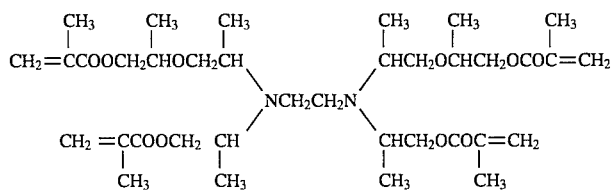

Compound G:

Compound H: (Monomer disclosed in JP-A-4-174437)

$$CH_3CH_2C\begin{cases}CH_2(OCH_2CH_2)_aOCOCH=CH_2\\CH_2(OCH_2CH_2)_bOCOCH=CH_2\\CH_2(OCH_2CH_2)_cOCOCH=CH_2\end{cases}$$

$a+b+c=15$

Compound I: (Monomer disclosed in JP-A-4-338954)

$CH_2=CH-COO(CH_2CH_2O)_nCO-CH=CH_2$ (A mixture of n=23; "A-1000" produced by Shin-Nakamura Kagaku K.K.)

Compound J: (Monomer disclosed in JP-A-5-94007)

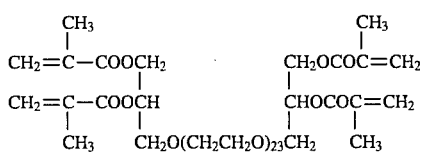

Compound K: (Monomer disclosed in JP-A-5-224415)

$CH_2O(CH_2CH_2O)_aCOCH=CH_2$
$|$
$CHO(CH_2CH_2O)_bCOCH=CH_2$
$|$
$CHO(CH_2CH_2O)_cCOCH=CH_2$
$|$
$CHO(CH_2CH_2O)_dCOCH=CH_2$
$|$
$CHO(CH_2CH_2O)_eCOCH=CH_2$
$|$
$CH_2O(CH_2CH_2O)_fCOCH=CH_2$ $a+b+c+d+e+f=40$

Compound L: (Monomer disclosed in JP-A-6-118629)

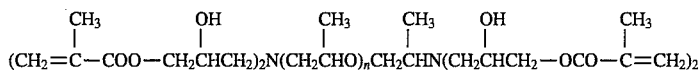

A mixture of n=5.6

Each of the resulting printing plates was exposed to 50 counts of light using the same vacuum exposing machine as used above through a positive film having a 200 lines/in. dot image and a gray scale (G/S) having an optical density difference of 0.15. The laminate film was stripped off and immediately thereafter the exposed plate was developed as follows.

Development Processing:

The exposed plate was soaked in water at 35° C. and rubbed with a developing pad in water to remove the silicone rubber layer from the unexposed area. The image area of the printing plate was dyed with a dyeing liquid having the following composition to evaluate sensitivity (G/S clear sensitivity) and dot reproducibility (dot area ratio (%) of the highlight reproduced).

| Dyeing Liquid: | |
| --- | --- |
| Crystal Violet | 0.1 part |
| Diethylene glycol monoethyl ether | 15 parts |
| Pure water | 85 parts |

Prior to printing, the non-image area of the printing plate was scratched with a sapphire needle having a diameter of 0.5 mm under a load varying from 100 g to 500 g using a scratch tester HEIDON-14. The printing plate was mounted on a printing machine Heidelberg GTO from which a dampening system had been removed, and printing was carried on using a printing ink TOYO KING ULTRA TUK AQUALESS G SUMI (produced by Toyo Ink Mfg. Co., Ltd.) to obtain 100,000 sheets. The scratching load at which the scratch on the non-image area began to appear on the copy (scratch resistance) and the number of copies at which the silicone rubber layer on the non-image area was broken to cause background stains (press life) were evaluated.

The results of the evaluation are shown in Table 2.

TABLE 2

| Example No. | Sensitivity | Dot Reproducibility (%) | Press Life | Scratch Resistance (g) |
| --- | --- | --- | --- | --- |
| Example 1 | 10 | 2 | ≧100,000 | 450 |
| Example 2 | 9 | 3 | ≧100,000 | 500 |
| Example 3 | 9 | 2 | ≧100,000 | 500 |
| Example 4 | 10 | 3 | ≧100,000 | 400 |
| Example 5 | 9 | 3 | ≧100,000 | 500 |
| Example 6 | 8 | 2 | ≧100,000 | 500 |
| Example 7 | 11 | 3 | ≧100,000 | 350 |
| Example 8 | 11 | 3 | ≧100,000 | 350 |
| Example 9 | 7 | 3 | ≧100,000 | 350 |
| Comparative Example 1 | development failure* | development failure | 60,000 | 100 |
| Comparative Example 2 | 4 | 2 | 70,000 | 150 |
| Comparative Example 3 | 4 | 2 | 70,000 | 150 |
| Comparative Example 4 | 5 | 3 | 70,000 | 100 |

TABLE 2-continued

| Example No. | Sensitivity | Dot Reproducibility (%) | Press Life | Scratch Resistance (g) |
| --- | --- | --- | --- | --- |
| Comparative Example 5 | 4 | 2 | 60,000 | 100 |
| Comparative Example 6 | 9 | 5 | 80,000 | 200 |
| Comparative Example 7 | 8 | 4 | 70,000 | 100 |

Note:
Development failure means that the silicone rubber layer on the unexposed area was not removed by the development processing.

The results in Table 2 prove that the lithographic printing plate requiring no fountain solution according to the present invention exhibits satisfactory sensitivity, dot reproducibility, press life, and scratch resistance.

As having been described, according to the present invention, the photosensitive layer of the printing plate provides a soft photocured layer upon being imagewise exposed, and the photosensitive layer on the unexposed area can be developed with an aqueous developer with satisfactory sensitivity and tone reproducibility. The resulting lithographic printing plate has excellent press life and scratch resistance.

While the invention has been described in detail and with reference to specific examples thereof, it will be apparent to one skilled in the art that various changes and modifications can be made therein without departing from the spirit and scope thereof.

What is claimed is:

1. A photosensitive plate for preparation of a lithographic printing plate requiring no fountain solution by imagewise exposure to light and development, said photosensitive plate comprising a support having provided thereon a photopolymerizable photosensitive layer and silicone rubber layer in this order, wherein the photopolymerizable photosensitive layer contains at least one photopolymerizable monomer represented by the following formula (I) and a photopolymerizable initiator:

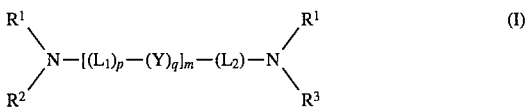

wherein m represents an integer of from 0 to 30;

Y represents —COO—, —OCO—, —CONH—, —O—, —NH— or —S—;

$L_1$ represents a substituted or unsubstituted alkylene group;

$L_2$ represents a substituted or unsubstituted alkylene group, a substituted or unsubstituted phenylene group or a substituted or unsubstituted aralkylene group;

p and q each represents 0 or 1; and $R^1$, $R^2$, and $R^3$ are the same or different and each represents a hydrogen atom, an alkyl group or a group represented by the following formula (II), provided that at least two of $R^1$, $R^2$ and $R^3$ are selected from the groups represented by the following formula (II):

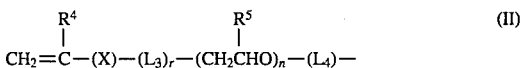

wherein n represents an integer of from 1 to 15, provided that the total number of an ethylene oxide group or a propylene oxide group in one molecule of a monomer represented by formula (I) is 30 or less;

$R^4$ represents a hydrogen atom or an alkyl group having from 1 to 4 carbon atoms;

$R^5$ represents a hydrogen atom or a methyl group, and where a plurality of $R^5$ groups are present, the plurality of $R^5$ groups may be the same or different;

X represents —COO—, —CONH— or a phenylene group;

$L_3$ and $L_4$ each represent a substituted or unsubstituted alkylene group; and r represents 0 or 1.

2. The photosensitive plate as claimed in claim 1, wherein m represents an integer of from 0 to 10.

3. The photosensitive plate as claimed in claim 1, wherein $L_1$ represents an alkylene group substituted with an alkyl group, an aryl group, an alkoxy group, a hydroxyl group or a halogen atom.

4. The photosensitive plate as claimed in claim 1, wherein $L_2$ represents an alkylene, phenylene or aralkylene group substituted with an alkyl group, an aryl group, an alkoxy group, a hydroxyl group or a halogen atom.

5. The photosensitive plate as claimed in claim 1, wherein n represents an integer of from 1 to 5.

6. The photosensitive plate as claimed in claim 1, wherein $L_3$ and $L_4$ each represent an alkylene group substituted with an alkyl group, an aryl group, an alkoxy group, a hydroxy group or a halogen atom.

7. The photosensitive plate as claimed in claim 1, wherein the total number of ethylene oxide groups or propylene oxide groups in one molecule of a monomer represented by formula (I) is from 2 to 25.

8. The photosensitive plate as claimed in claim 1, wherein the photopolymerization initiator is selected from the group consisting of benzophenone derivatives, benzoin derivatives, quinones, sulfur compounds, azo compounds, diazo compounds, halogen compounds and peroxides.

9. The photosensitive plate as claimed in claim 1, wherein the photopolymerizable photosensitive layer further contains a film-formable polymeric compound.

10. The photosensitive plate as claimed in claim 1, wherein the photopolymerizable photosensitive layer further contains a monomer or oligomer having a polymerizable ethylenically unsaturated group other than the monomer represented by formula (I).

11. The photosensitive plate of claim 1 wherein the photopolymerizable monomer comprises a mixture of compounds having the following formula:

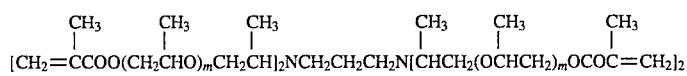

wherein the average value of m is 3.5.

12. The photosensitive plate of claim 1 wherein the photopolymerizable monomer comprises a mixture of compounds having the following formula:

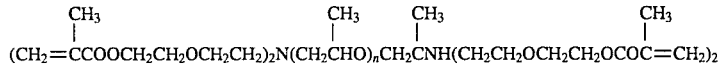

wherein the average value of n is 5.6.

13. The photosensitive plate of claim 1 wherein the photopolymerizable monomer comprises a mixture of compounds having the following formula:

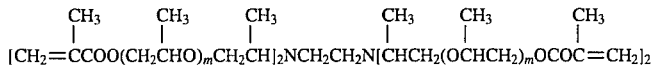

wherein the average value of m is 1.5.

14. The photosensitive plate of claim 1 wherein the photopolymerizable monomer comprises a mixture of compounds having the following formula:

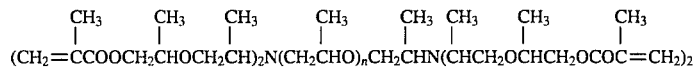

wherein the average value of n is 5.6.

15. The photosensitive plate of claim 1 wherein the photopolymerizable monomer comprises a mixture of compounds having the following formula:

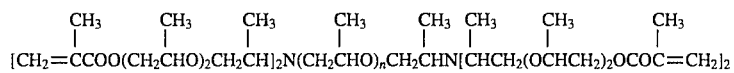

wherein the average value of n is 5.6.

16. The photosensitive plate of claim 1 wherein the photopolymerizable monomer comprises a compound having the following formula:
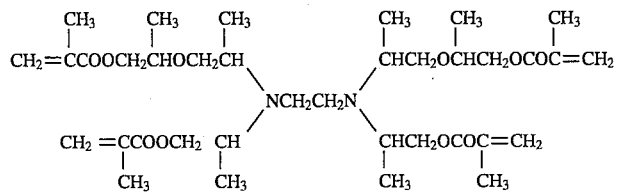
* * * * *